(12) United States Patent
DeNatale et al.

(10) Patent No.: US 8,088,667 B2
(45) Date of Patent: *Jan. 3, 2012

(54) METHOD OF FABRICATING VERTICAL CAPACITORS IN THROUGH-SUBSTRATE VIAS

(75) Inventors: Jeffrey F. DeNatale, Thousand Oaks, CA (US); Philip A. Stupar, Oxnard, CA (US); Alexandros P. Papavasiliou, Thousand Oaks, CA (US); Robert L. Borwick, III, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 298 days.

This patent is subject to a terminal disclaimer.

(21) Appl. No.: 12/291,263

(22) Filed: Nov. 5, 2008

(65) Prior Publication Data

US 2010/0110607 A1    May 6, 2010

(51) Int. Cl.
*H01L 21/443* (2006.01)
(52) U.S. Cl. ............... 438/386; 438/667; 257/E21.011
(58) Field of Classification Search ............ 438/391
See application file for complete search history.

(56) References Cited

U.S. PATENT DOCUMENTS

| | | | |
|---|---|---|---|
| 4,855,017 A | 8/1989 | Douglas | 156/643 |
| 4,961,821 A | 10/1990 | Drake et al. | 156/647 |
| 5,421,083 A | 6/1995 | Suppelsa et al. | 29/852 |
| 5,501,893 A | 3/1996 | Laermer et al. | 428/161 |
| 6,278,181 B1 | 8/2001 | Maley | 257/712 |
| 6,458,615 B1 | 10/2002 | Fedder et al. | 438/50 |
| 6,565,730 B2 | 5/2003 | Chakravorty et al. | 205/122 |
| 6,716,737 B2 | 4/2004 | Plas et al. | 438/612 |
| 6,717,071 B2 | 4/2004 | Chang et al. | 174/266 |
| 6,852,627 B2 | 2/2005 | Sinha et al. | 438/687 |
| 6,960,479 B2 | 11/2005 | Li et al. | 438/3 |
| 6,960,495 B2 | 11/2005 | Vyvoda | 438/131 |
| 6,963,483 B2 | 11/2005 | Chakravorty et al. | 361/306.3 |

(Continued)

FOREIGN PATENT DOCUMENTS

EP     926723 A1    6/1999

(Continued)

OTHER PUBLICATIONS

Eisenbraun, et al., 3D Integration—The Packaging Technology for Tomorrow'S Performance Needs, Chip 9, Unaxis Semiconductors, (Sep. 2003), pp. 14-17.

(Continued)

*Primary Examiner* — Stephen W Smoot
(74) *Attorney, Agent, or Firm* — Koppel, Patrick, Heybl & Philpott

(57) ABSTRACT

A fabrication method which forms vertical capacitors in a substrate. The method is preferably an all-dry process, comprising forming a through-substrate via hole in the substrate, depositing a first conductive material layer into the via hole using atomic layer deposition (ALD) such that it is electrically continuous across the length of the via hole, depositing an electrically insulating, continuous and substantially conformal isolation material layer over the first conductive layer using ALD, and depositing a second conductive material layer over the isolation material layer using ALD such that it is electrically continuous across the length of the via hole. The layers are arranged such that they form a vertical capacitor. The present method may be successfully practiced at temperatures of less than 200° C., thereby avoiding damage to circuitry residing on the substrate that might otherwise occur.

40 Claims, 5 Drawing Sheets

U.S. PATENT DOCUMENTS

| | | | |
|---|---|---|---|
| 6,968,110 B2 | 11/2005 | Patel et al. | 385/131 |
| 6,984,561 B2 | 1/2006 | Herner et al. | 438/257 |
| 6,995,072 B2 | 2/2006 | Walker et al. | 438/400 |
| 2002/0134581 A1 | 9/2002 | Figueroa | |
| 2003/0003724 A1 | 1/2003 | Uchiyama et al. | |
| 2003/0104649 A1 | 6/2003 | Ozgur et al. | |
| 2004/0069529 A1 | 4/2004 | Oggioni et al. | |
| 2004/0119166 A1 | 6/2004 | Sunohara | |
| 2004/0166688 A1 | 8/2004 | Xie et al. | |
| 2005/0093048 A1 | 5/2005 | Griffiths | |
| 2005/0093049 A1 | 5/2005 | Kundalgurki et al. | |
| 2005/0099762 A1 | 5/2005 | Wermer et al. | |
| 2005/0287760 A1 | 12/2005 | Yan et al. | |
| 2006/0003566 A1 | 1/2006 | Emesh | |
| 2010/0001378 A1* | 1/2010 | DeNatale et al. | 257/621 |

FOREIGN PATENT DOCUMENTS

| | | |
|---|---|---|
| WO | WO 8302368 A1 | 7/1983 |
| WO | WO 9908318 | 2/1999 |

OTHER PUBLICATIONS

Liu, C., Progress in MEMS and Micro Systems Research, IMAPS/ACerS 1$^{st}$ International Conference and Exhibition on Ceramic Interconnect and Ceramic Microsystems Technologies (CICMT), Baltimore Marriott Waterfront Hotel, Baltimore MD, (Apr. 10-13, 2005).

Pham, N. et al., IC-Compatible Two-Level Bulk Micromachining Process Module for RF Silicon Technology, IEEE Transactions on Electron Devices, vol. 48, No. 8, (Aug. 2001), pp. 1756-1764.

Garrou, Phillip, Future ICs Go Vertical, Research & Development Institute, Feb. 1, 2005, pp. 1-8.

George, S. M. et al., Surface Chemistry for Atomic Layer Growth, J. Phys. Chem., vol. 100, No. 31, 1996, pp. 13121-13131.

\* cited by examiner

METHOD OF FABRICATING VERTICAL CAPACITORS IN THROUGH-SUBSTRATE VIAS

U.S. GOVERNMENT RIGHTS

The invention was made with Government support promoted by the Defense Advanced Research Projects Office (DARPA), Microsystems Technology Office (MTO), under contract N00173-06-C-2055 awarded by the U.S. Department of the Navy, Office of Naval Research (ONR), Naval Research Laboratory (NRL), to Rockwell Collins, Inc. (RCI), and under purchase order 4502114317 awarded by RCI to Teledyne Scientific & Imaging, LLC. The Government has certain rights in the invention.

FIELD OF THE INVENTION

This invention is directed to a method for fabricating vertical capacitors.

BACKGROUND

The fabrication of integrated circuit (IC) chips has become a sophisticated process that can allow complex circuitry to be densely packaged onto a single substrate or wafer. Originally, most chips were fabricated in a simple planar design. However, planar chip designs limit the amount of circuitry that can be placed on a single substrate.

To overcome some of the limitations resulting from the planar design, designers began stacking chips to form three-dimensional designs. Vias extending through the substrate—i.e., "through-substrate vias"—create three-dimensional interconnects which facilitate connection to the circuitry throughout the chip, thereby allowing the implementation of more advanced circuits and enabling a higher density of complex circuitry to be placed within a given die area. Furthermore, a three-dimensional design with through-substrate vias can enable advanced micro-electronic chip stacking, which can result, for example, in increased processing power for image data and signal processing.

Another area that can be improved with 3D integration is capacitive circuit components. Planar RF filters and switched capacitor bank filters, for example, occupy significant die area; as such, integrated single-chip filters are often limited by die size, since the conventional metal-insulator-metal (MIM) capacitors used by such filters require substantial die area for large capacitance values. This can be overcome with the use of vertical capacitor structures, which are conventionally formed by adding additional insulating and conductive layers to a through-substrate via. Vertical capacitors enable substantial reductions in size to be achieved, with a direct correlation to reduced die cost. Such vertical capacitor structures provide advantages in readout circuits, for example, such as those for electronic imaging applications and active LIDAR. These circuits presently use planar capacitors for storage of photogenerated charge. For small pixel devices, the amount of charge storage capacity provided by conventional IC fabrication technology is limited by the physical constraints of pixel pitch. This limits the maximum achievable full well capacity, and can thus negatively impact important focal plane array characteristics, such as maximum intensity and dynamic range. Having the ability to significantly increase the capacitor value and/or the number of capacitors in a circuit, while preserving small die area, could relax these constraints and allow greater design flexibility and improved device performance.

As noted above, one method of forming a vertical capacitor requires the fabrication of a through-substrate via. While a number of techniques are known for forming such vias, they are currently limited. In one approach, through-substrate vias have been formed in thick substrates—e.g., 200-400 µm; the thickness enables the substrates to retain mechanical durability and to be easily handled and processed without the need for sequential stacking and thinning operations. Using this approach, substrates are etched and the formed vias are electrically insulated and metallized. Although this approach provides some advantages, it introduces other limitations, such as the inability to fabricate small-diameter, fine-pitch vias. Indeed, using current etching techniques, the formation of high aspect ratio (i.e., ratio of depth to diameter) vias results in a large diameter-to-pitch (i.e., the center-to-center measurement between vias) ratio for the vias. This limits the etch depth of the vias, and also reduces the amount of available space on the substrate for other uses. Current techniques typically produce vias having diameters of about 4 µm with a depth of about 20 µm (using low temperature techniques) and 100 µm diameters with a depth of about 500 µm (using high temperature techniques); thus, an aspect ratio of about 5:1 is provided with either high or low temperature techniques. Both dry etching and wet etching have been demonstrated for the thick wafer processing, and both suffer from constraints on via size and separation. In addition, it is very difficult to reliably deposit electrical isolation material layers and metallic conductors using low process temperatures in high aspect ratio vias.

To reduce via diameters, some techniques sequentially stack, bond and thin multiple wafers into a 'single' wafer stack and form the vias through only a single thin layer of the stacked wafers at a time, thereby reducing the aspect ratio and diameter required of an individual via. This approach involves wafer 'thinning', in which the wafers to be stacked are bonded and one portion (non-circuit containing, exposed surface) of the stacked wafers is thinned to reduce the wafer thickness, typically down to 10-25 µm. At this thickness, small diameter vias can be etched through the thinned layer while maintaining separation between neighboring vias. Alternatively, the via could be etched to a limited depth prior to the bonding, and then have its bottom (non-circuit containing) surface exposed in the thinning operation after bonding. This approach can use well-developed fabrication processes; however, disadvantages arise from the need for sequential processing of each successive layer and the complexity of intermediate testing. Further, the thinning of the stacked wafers reduces their integrity and makes them more susceptible to breakage during use and damage from handling. Further still, many current bonding techniques involve high temperatures, high voltage and/or high pressure, each of which poses difficulties if the stacking includes prefabricated integrated circuits with multi-level interconnects. Further, sequential circuit wafers can only be stacked in one orientation, with active circuitry at the bond interface, since the thinning process must only remove unprocessed substrate. Finally, the wafer-level sequential stacking can introduce stacked device yield impacts resulting from the random alignment of defects in a die from one layer with a good die in another, reducing operability at the stack level.

In addition to a hole that passes completely through a substrate, a through-substrate via generally also requires an insulating layer lining the inner surfaces of the hole, and a conductive layer over the insulating layer. For a high aspect ratio via having a narrow diameter, it can be difficult to provide these insulating and conductive layers. One technique for forming such a via is described in co-pending patent application Ser. No. 11/167,014 to Borwick et al. and assigned to the present assignee. Here, wet processing is used to provide the via's sidewall seed layer and conductive layer. However, it can be difficult to achieve uniform seed layer coverage using wet processing, and particulates in the liquid solution can clog the vias, particularly those having a small diameter.

SUMMARY OF THE INVENTION

A vertical capacitor fabrication method is presented which overcomes the problems noted above, providing high aspect ratio vertical capacitors with a process that eliminates difficulties associated with wet processing.

The present fabrication method forms vertical capacitors in a substrate having first and second surfaces. The method is preferably an all-dry process, comprising:

forming a through-substrate via hole in the substrate;

depositing a first conductive material layer into the via hole using atomic layer deposition (ALD) such that the first conductive material layer is electrically continuous across the length of the via hole;

depositing a first isolation material layer over the first conductive layer using ALD, the first isolation material layer being electrically insulating, continuous and substantially conformal; and depositing a second conductive material layer over the first isolation material layer using ALD such that the second conductive material layer is electrically continuous across the length of the via hole;

such that the first and second conductive material layers and the first isolation material layer form a vertical capacitor.

The through-substrate via hole is preferably formed by dry etching a first cavity having a first diameter into the substrate's first surface, and dry etching a second cavity having a second diameter into the substrate's second surface, such that the first and second cavities form a single continuous aperture through the substrate. The present method may be successfully practiced at temperatures of less than 200° C., thereby avoiding damage to circuitry residing on the substrate that might otherwise occur.

These and other features, aspects, and advantages of the present invention will become better understood with reference to the following drawings, description, and claims.

BRIEF DESCRIPTION OF THE DRAWINGS

The detailed description of embodiments of the invention will be made with reference to the accompanying drawings, wherein like numerals designate corresponding parts in the figures.

DETAILED DESCRIPTION OF THE INVENTION

Figure 1A:
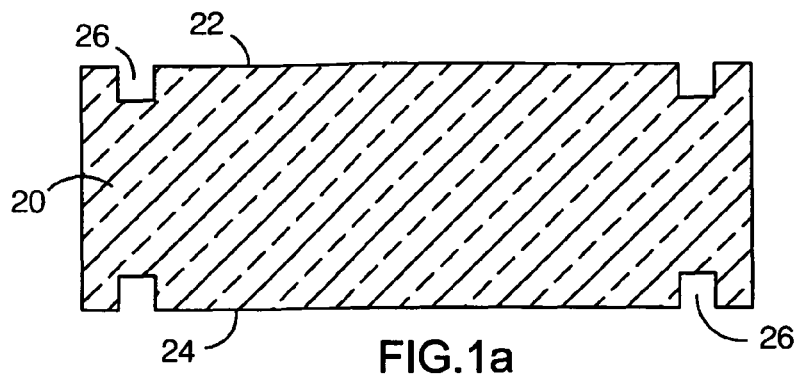
FIGS. 1a-1j are sectional views of a fabrication process for forming high aspect ratio vertical capacitors in accordance with the present invention.

The present method is directed to a process for fabricating high aspect ratio vertical capacitors. The basic process steps are illustrated in the series of sectional views shown in FIGS. 1a-1i. In FIG. 1a, a substrate 20 has a first surface 22 and a second surface 24. Circuitry (not shown) may be disposed on first surface 22, on second surface 24, and/or between surfaces 22 and 24. The substrate may be made from any of a number of semiconductor material layers, including but not limited to, silicon, gallium arsenide or indium phosphide. Alignment marks 26 may be etched on the first and second surfaces, to facilitate alignment of the substrate during subsequent process steps.

Fabricating a vertical capacitor per the present invention requires that a via first be formed through substrate 20. The through-substrate via is preferably, though not necessarily, formed by etching first and second cavities having different diameters into surfaces 22 and 24, respectively, such that they form a continuous aperture. This process is described below, though other methods of forming a through-substrate via might also be used. As described later, the second cavity can be a non-circular shape to increase surface area.

Figure 1B:
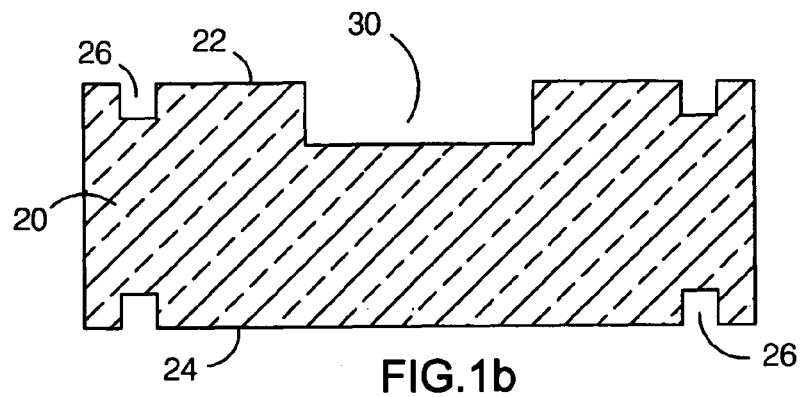
Figure 1C:
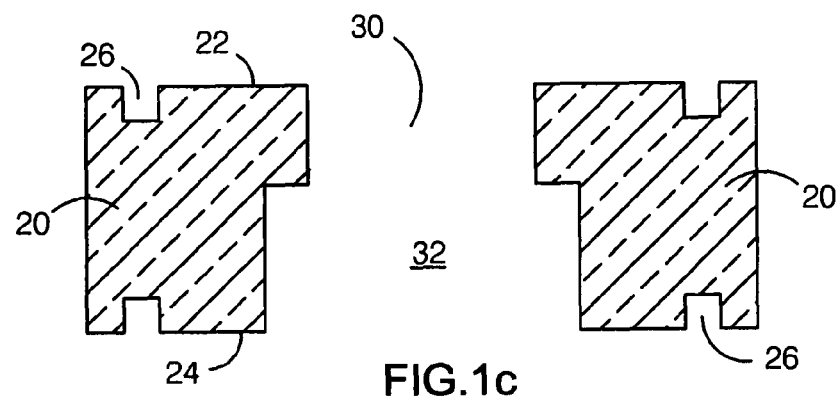

In FIG. 1b, a first cavity 30 is etched into first surface 22. The first cavity has a first diameter, and extends a first depth into the substrate. The first diameter is typically chosen to minimize the consumed circuit area on surface 22, and the first depth is typically chosen to enable the first cavity to extend below the depth of any active circuitry on surface 22. Then, as shown in FIG. 1c, a second cavity 32 having a second diameter, is etched coaxially with first cavity 30 into second surface 24. The second cavity is etched to a second depth such that it communicates with first cavity 30 to form a continuous aperture through the entire thickness of the substrate. The first and second cavities preferably extend to depths in the range of 20 µm-200 µm and 100 µm-350 µm, respectively, and have diameters of 2 µm-8 µm and 6 µm-25 µm, respectively. The larger diameter of the second cavity enables a greater depth to be achieved at the same aspect ratio. This enables the continuous aperture to extend through a greater total wafer thickness, while minimizing the circuit area on surface 22 consumed by the via.

The cavities are preferably formed by dry etching, preferably using a deep reactive ion etching process ("DRIE"). A preferred DRIE process used for silicon etching known as the Bosch process utilizes time-sequenced alternating etch and passivation steps. An etchant such as sulfur hexafluoride $SF_6$ is used to etch a portion of the cavity into the substrate. To passivate the sidewall of the cavity and prevent further lateral etching, an insulating layer is subsequently deposited using a separate gas composition which includes a species such as octafluorocyclobutane $C_4F_8$. This process is repeated until the desired depth is achieved. Etching via this process allows for high selectivity and achieves substantially vertical side walls, with aspect ratios as high as 40:1 or more. This high aspect ratio facilitates the production of smaller diameter cavities and smaller via-to-via spacings, as it reduces the amount of lateral blooming during etching and reduces side wall scalloping.

Figure 1D:
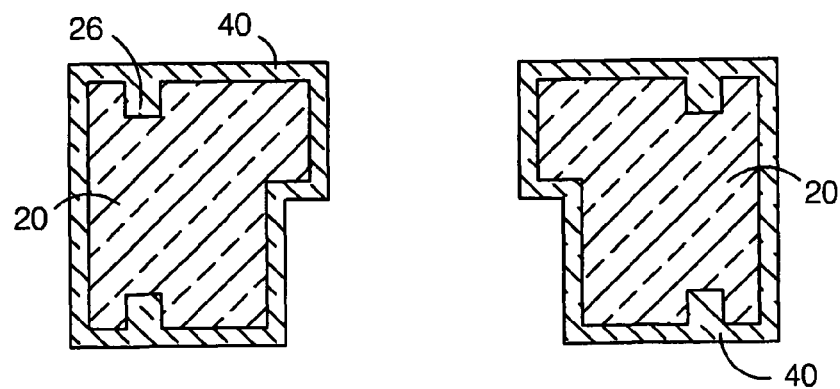

A vertical capacitor is accordance with the present invention can be 'floating' relative to the substrate, in which the capacitor's metal layers are isolated from substrate 20, or non-floating. If floating, the next step is to deposit an isolation material layer 40 as shown in FIG. 1d. Here, isolation material layer 40 is deposited directly onto substrate 20 and onto the interior walls of the aperture so as to provide an isolation material layer that is electrically insulating, continuous and substantially conformal. The uniform coverage of the sidewalls with isolation material layer 40 acts to electrically isolate the through-substrate via from the substrate, as well as from other through-substrate vias being fabricated in substrate 20. Isolation material layer 40 may be formed by any of several methods, including thermal oxidation, plasma enhanced chemical vapor deposition (PECVD) or chemical vapor deposition (CVD), or (ALD).

The isolation material layer preferably comprises inorganic oxides capable of providing electrical insulation and conformal surface coatings; metal oxides, including the oxides of aluminum, titanium, tantalum, niobium, zirconium, hafnium, lanthanum, yttrium, cerium, silicon, scandium, chromium, and erbium, are suitable.

ALD is a gas phase chemical process used to create thin film coatings that are highly conformal and have extremely precise thickness control. The majority of ALD reactions use two chemicals, typically called precursors. These precursors react with a surface one-at-a-time in a sequential manner. By exposing the precursors to the growth surface repeatedly, a thin film is deposited. Additional details about ALD can be found, for example, in "Surface Chemistry for Atomic Layer Growth", S. M. George et al., *J. Phys. Chem.*, Vol. 100, No. 31 (1996), pp. 13121-13131.

Figure 1E:
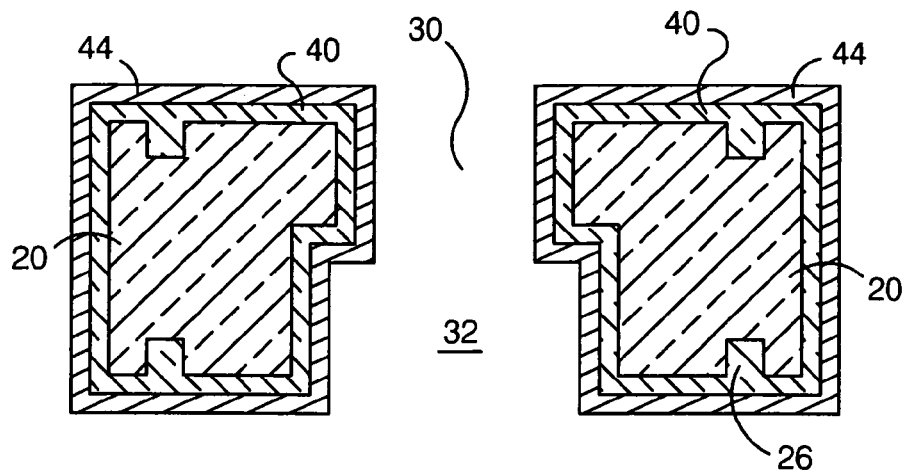

After the isolation material layer 40 (if used) has been deposited onto the substrate, an electrically conductive material layer 44 is deposited over the isolation material layer using ALD such that the conductive material layer is electrically continuous across the length of the via hole; this is shown in FIG. 1e. (If the capacitor is non-floating, conductive material layer 44 is deposited using ALD directly onto substrate 20 and onto the interior walls of the aperture, such that layer 44, and thus one terminal of the capacitor, are in contact with substrate 20 and therefore at ground potential). The conductive material layer is preferably chosen from a group consisting of nickel, palladium, platinum, ruthenium, tungsten, iridium, copper, molybdenum or zinc oxide. The dry etching and ALD deposition steps are preferably conducted at a temperature of less than 200° C., such that circuitry residing on the substrate, such as CMOS circuitry, is not damaged by excessive heat.

In some cases, it may be desirable to 'activate' isolation material layer 40 prior to the deposition of conductive material layer 44, to make the isolation material layer more conducive to receiving the conductive material layer. This can be accomplished by depositing a seed layer (not shown) onto isolation material layer 40; this is preferably accomplished using ALD, which deposits a conformal seed layer uniformly on the deep-etched sidewalls of the via. A seed layer is selected which will cause a reaction with conductive material layer 44 when the conductive material layer is deposited onto the substrate; palladium is one possible seed layer. Once isolation material layer 40 is activated, conductive material layer 44 is deposited onto the activated isolation material layer. This seed layer, if conductive, may also reduce the series resistance of the final device.

Figure 1F:
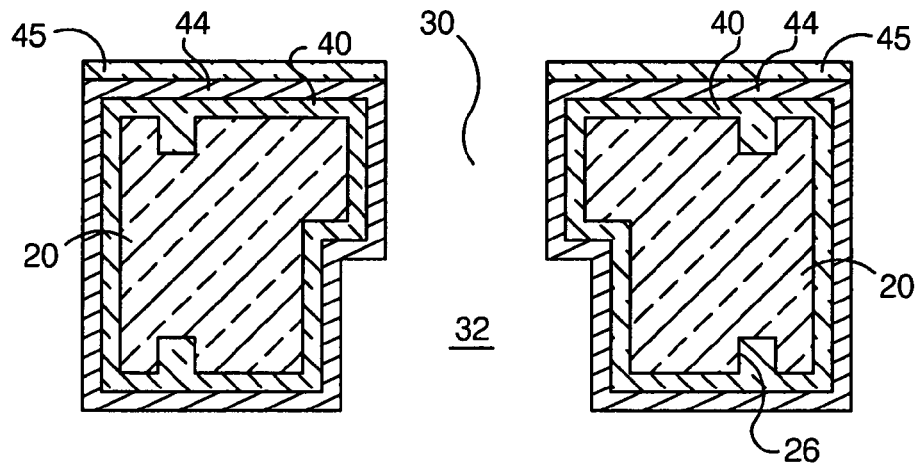

Next, a thick insulating layer may be deposited over conductive material layer 44, and then patterned and etched to provide insulating layer 45 as shown in FIG. 1f. Layer 45 may be, for example, an oxide, nitride, or oxynitride, deposited by means of plasma enhanced chemical vapor deposition (PECVD). A completed vertical capacitor will include metal layer 44 and a second metal layer deposited in a subsequent processing step. Layer 45 serves as an etch stop layer, to facilitate selective patterning of the second metal layer without exposing metal layer 44.

Figure 1G:
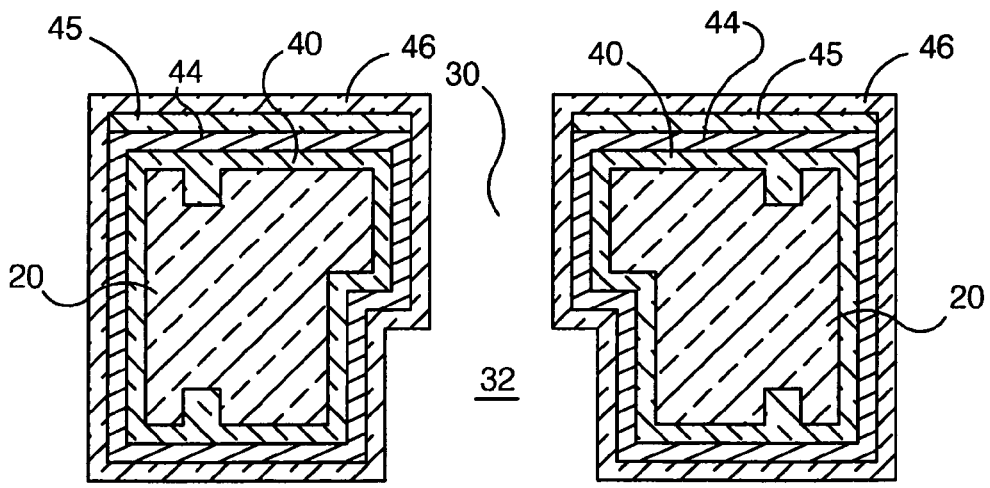

An isolation material layer that will serve as the capacitor's dielectric layer is deposited next. In FIG. 1g, an isolation material layer 46 is deposited using ALD such that it is electrically insulating, continuous and substantially conformal. The isolation material layer 46 is preferably made from a material which has a high dielectric constant, such as hafnium oxide ($HfO_2$), in order to maximize the structure's capacitance for a given thickness of layer 46.

Figure 1H:
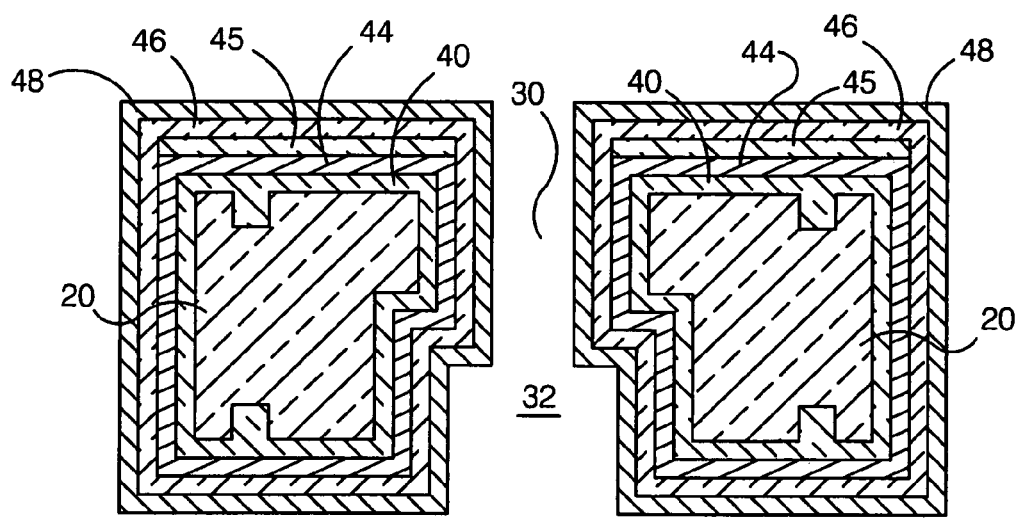

To provide the capacitor's second metal layer, another electrically conductive material layer 48 is deposited using ALD such that the conductive material layer is electrically continuous across the length of the via hole; this is shown in FIG. 1h. The conductive material layer is preferably chosen from a group consisting of nickel, palladium, platinum, ruthenium, tungsten, iridium, copper or zinc oxide.

As above, it may be desirable to 'activate' isolation material layer 46 prior to the deposition of conductive material layer 48, to make the isolation material layer more conducive to receiving the conductive material layer. This can be accomplished by depositing a seed layer (not shown) onto isolation material layer 46, preferably using ALD.

Figure 1I:
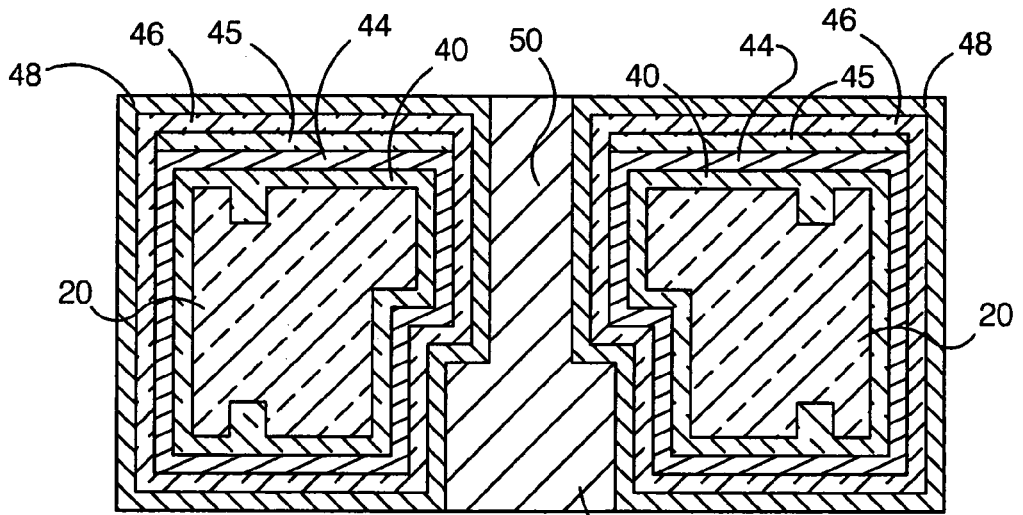

Preferably, any portions of cavities 30 and 32 which were not already filled by layers 40, 44, 46 and 48 are now filled with a metal 50, as shown in FIG. 1i. This hole filling is done for two reasons. First, processing of the substrate with the hole in it is difficult: photoresist material layers may get sucked into the hole by vacuum chucks, and air bubbles that get trapped in the hole tend to pop and degrade the cosmetics of the subsequent surface pattern. Second, the conductive material layer 48 deposited by ALD is typically very thin, and hence may have a relatively high resistance. The hole is preferably filled using a plating process—preferably, an electroless plating of a material layer like nickel, gold, or copper; uniform electroless plating is facilitated by the uniform depositions achieved using ALD. This reduces the resistance of the center conductor and physically plugs the hole to permit resist processing. Electrolytic plating may also be used. This hole filling can also be used in the case of non-circular cavity designs on surface 24, reducing deep surface relief that can interfere with subsequent processing.

Figure 1J:
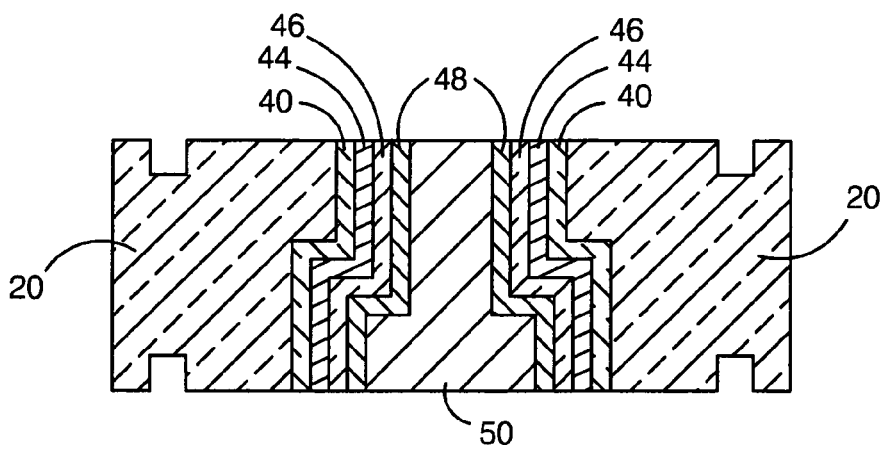
Figure 2:
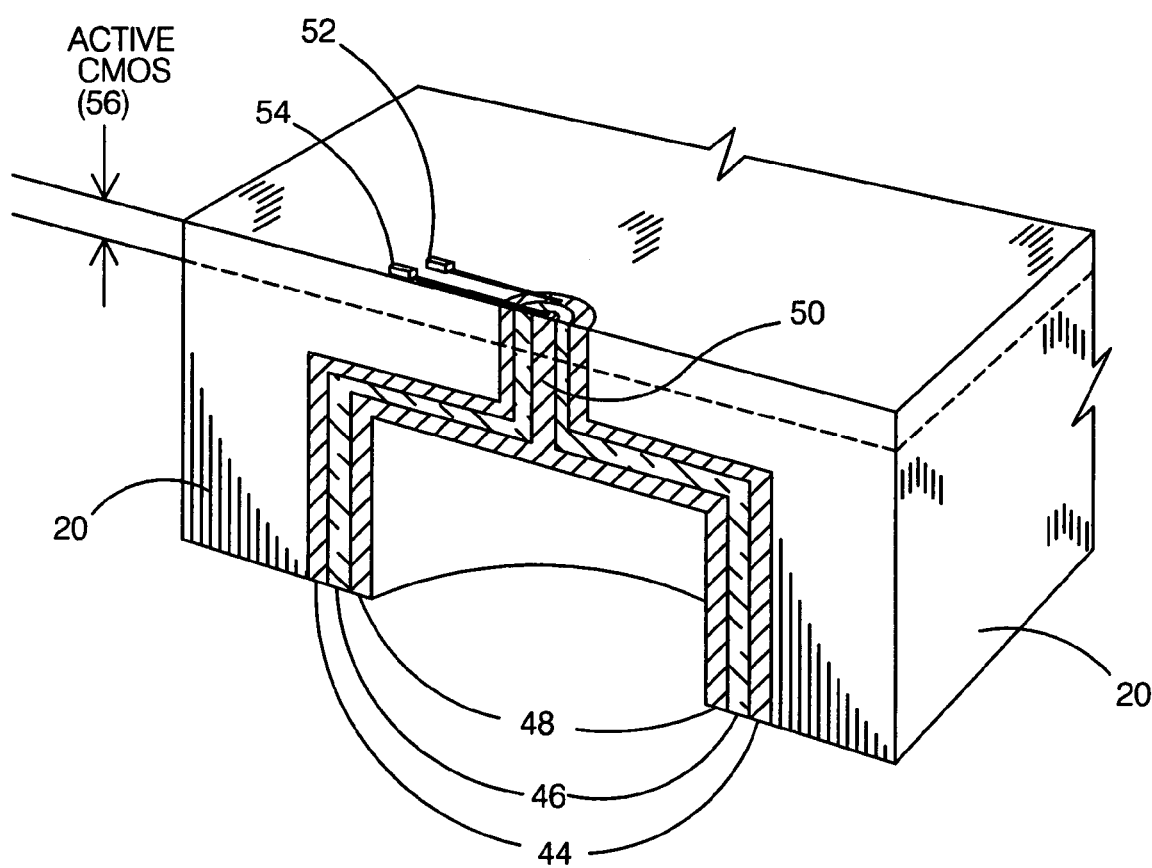
FIG. 2 is a perspective view of a vertical capacitor formed in accordance with the present fabrication process.

Additional processing may be performed to remove the isolation and conductive layers from areas where they are not needed, but leaving the completed vertical capacitor; one possible result is shown in FIG. 1j. Further, additional isolation material layers and conductive metal traces may be fabricated on surfaces 22 and/or 24 to route the electrical interconnection points to the desired locations on the surfaces. These process steps are not shown, and use fabrication techniques well known to those skilled in semiconductor processing. A perspective view of one possible embodiment of a completed vertical capacitor, including electrical contacts 52 and 54, is shown in FIG. 2. In this example, active CMOS components 56 have been fabricated on the top surface of substrate 20. For illustration purposes, isolation layer 40 and the lower portion of hole-filling metal 50 are not shown in FIG. 2.

With the possible exception of the hole-filling step, the present method is an all-dry process, thereby eliminating the possibility of liquid solution particulates clogging the through-substrate vias, as may happen when using prior art techniques. Wet processing techniques may be used in the final steps of the process in FIG. 1 to plug the via, since at this stage the via is isolated and electrically continuous across its length, and thus clogging due to solution particulates does not reduce via operability.

The present ALD-based process provides good control over layer thickness (typically, to within several nanometers), such that conformal coatings and high yields are reliably achieved. This also enables the fabrication of a very thin dielectric layer 46, further increasing the potential capacitance of the device. Furthermore, the ability to deposit both insulators and metals using ALD provides a means of forming both isolation and conductive layers in a single process operation. Note, however, that the processing time needed for the present process may be considerably longer than that required by prior art methods, but the process is compatible with batch fabrication and automated operation. Employing ALD results in all surfaces being coated with the material layer being deposited; as such, it is necessary to pattern and etch the substrate to remove the deposited isolation and conductive material layers from areas where they are not needed. The present method enables high aspect ratio vertical capacitors to be fabricated in substrates having a thickness of greater than 50 μm. For best performance, the conductive material layers should have a high conductivity, and the isolation material layers should have a high dielectric breakdown strength.

Figure 3:
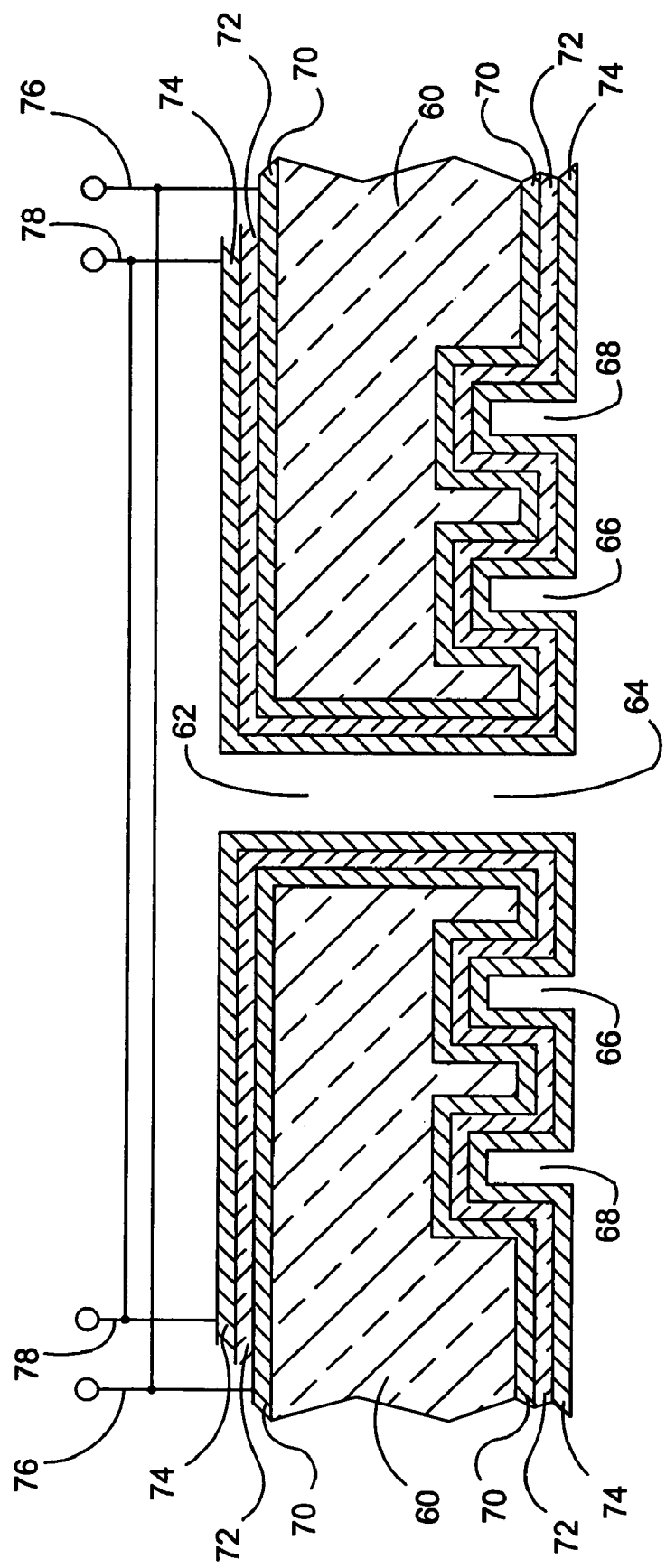
FIG. 3 is a sectional view of another possible embodiment of a vertical capacitor formed in accordance with the present fabrication process, which includes an extended backside etch pattern.

Additional techniques can be employed to further increase the capacitance that can be achieved by the present method. For example, extended etch patterns can be formed in the sidewalls of second cavity 32, such that the cavity's surface area—and thereby the structure's capacitance—is increased. Another approach is to vary the shape of the structure; for example, the capacitor's two metal layers and intervening dielectric layer can be formed into a spiral shape or a meandering line, thereby providing more surface area and more capacitance. One possible example is shown in FIG. 3. Fabrication of this vertical capacitor structure starts with a two-sided etch: on the topside of a substrate 60, a circular via 62 is etched, while on the backside, a central circular via 64 is etched, along with two concentric circular trenches 66, 68 around it. The central vias meet and form a continuous via through the substrate.

The etched substrate then goes through a first ALD deposition step in which the capacitor's first metal layer 70 is deposited, a second ALD deposition step in which the capacitor's dielectric layer 72 is deposited, and a third ALD deposition step in which the capacitor's second metal layer 74 is deposited. A hole-filling step (not illustrated) might also be performed in which any remaining through-substrate via is filled with metal. The deposited layers are continuous over the surfaces, and bridge between the two backside trenches, going over the unetched (surface) portions of the substrate and coating the bottoms of the etched trenches. Contacts 76 and 78 to metal layers 70 and 74, respectively, are provided to access the two terminals of the capacitor. Thus, by providing additional backside etch trenches, additional sidewall surface area is created, which creates additional capacitance.

The present process is well-suited to use with a multi-layer stack of substrates, in which a substrate containing vertical capacitors as described herein is bonded together with a plurality of additional substrates. The bonding between substrates is effected with, for example, solder bumps, indium columns, Au—Au thermocompression bonding or glue. The bonding means provides a mechanical function, and can also provide an electrical function when the bonds effect electrical interconnections between individual substrate layers. Signals may be routed from one substrate to another through vias, as well as via the bonding means.

Although the foregoing described the invention with preferred embodiments, this is not intended to limit the invention. Indeed, embodiments of this invention can be combined with other circuit chips and systems. For instance, embodiments of the invention can be used for compact electronic circuits with multiple stacking layers and circuitry. Other uses include an enhanced three-dimensional electronic imager having wide dynamic range and pixel level image processing due to the density with which vertical capacitors can be fabricated on the wafer, RF filters, FPA ROICs, and 3D consumer electronics. Other applications include a vertically interconnected sensor array which provides signal processing in conjunction with infrared sensor systems, an arrayed acoustic sensing system, LADAR, and microprocessor circuits in which latency across the chip presents an issue.

As seen from the foregoing, substrates having high aspect ratio through-substrate vias are intended to be used as standalone substrates or in combination with other types of substrates or systems. In this regard, the foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

We claim:

1. An all-dry process for fabricating a vertical capacitor in a semiconductor substrate, the substrate having a first surface and a second surface, comprising:
   forming a through-substrate via hole in a semiconductor substrate, said via hole having an associated length;
   depositing a first conductive material layer into the via hole using ALD such that said first conductive material layer is electrically continuous across the length of said via hole;
   depositing a first isolation material layer over said first conductive layer using atomic layer deposition (ALD), said first isolation material layer being electrically insulating, continuous and substantially conformal; and
   depositing a second conductive material layer over said first isolation material layer using ALD such that said second conductive material layer is electrically continuous across the length of said via hole;
   such that said first and second conductive material layers and said first isolation material layer form a vertical capacitor.

2. The process of claim 1, wherein said isolation material layer has a high dielectric constant.

3. The process of claim 2, wherein said isolation material layer is hafnium oxide ($HfO_2$).

4. The process of claim 1, wherein the conductive material layer for said first and second conductive material layers is chosen from a group consisting of nickel, palladium, platinum, ruthenium, tungsten, iridium, copper, molybdenum or zinc oxide.

5. The process of claim 1, further comprising depositing a second isolation material layer directly onto the substrate and onto the interior semiconductor walls of said through-substrate via hole prior to the deposition of said first conductive material layer, said second isolation material layer being electrically insulating, continuous and substantially conformal, such that said vertical capacitor is electrically floating relative to the substrate.

6. The process of claim 5, wherein the method by which said second isolation material layer is deposited by a method is selected from the group consisting of thermal oxidation, plasma enhanced chemical vapor deposition (PECVD), chemical vapor deposition (CVD), or ALD.

7. The process of claim 5, further comprising preparing said second isolation material layer by activating it with a seed layer which reacts with said first conductive material layer.

8. The process of claim 7, wherein said seed layer is deposited by ALD.

9. The process of claim 1, further comprising forming conductive metal traces on one or both of said first and second substrate surfaces to provide electrical connections to the conductive material layers of said vertical capacitor.

10. The process of claim 1, further comprising filling said via hole with a conductive material layer after depositing said second conductive material layer.

11. The process of claim 10, wherein said via hole is filled using an electroless or electrolytic plating process.

12. The process of claim 1, wherein said steps of forming said through-substrate via hole, depositing said first isolation material layer, and depositing said conductive material layers are performed in a low temperature range.

13. The process of claim 12, wherein said low temperature range is <200° C.

14. The process of claim 1, further comprising preparing said first isolation material layer by activating it with a seed layer which reacts with said second conductive material layer.

15. The process of claim 14, wherein said seed layer is deposited by ALD.

16. The process of claim 1, wherein the depth of said through-substrate via hole is greater than 100 μm.

17. The process of claim 1, wherein said through-substrate via hole is formed by:
dry etching a first cavity into said substrate's first surface, said first cavity having a first diameter; and
dry etching a second cavity into said substrate's second surface, said second cavity having a second diameter, wherein the first and second cavities form a single continuous aperture through the substrate.

18. The process of claim 17, wherein said first diameter and said second diameter are substantially equal.

19. The process of claim 17, wherein said first diameter is less than said second diameter.

20. The process of claim 17, wherein said first and second cavities extend to depths in the range of 20 μm-200 μm and 100 μm-350 μm, respectively.

21. The process of claim 17, wherein said first and second diameters are in the range of 2 μm-8 μm and 6 μm-25 μm, respectively.

22. The process of claim 17, wherein said first and second cavities are dry etched using a deep reactive ion etching (DRIE) process.

23. The process of claim 22, wherein said DRIE process is the Bosch process.

24. The process of claim 17, wherein said first surface contains active circuitry and said first cavity is etched so as to have a depth which extends below the depth of the active circuitry on said first surface.

25. The process of claim 1, wherein said deposition of said first isolation material layer by ALD comprises deposition of inorganic oxides capable of providing electrical insulation and conformal surface coatings.

26. The process of claim 25, wherein said first isolation material layer is chosen from a group of metal oxides consisting of the oxides of aluminum, titanium, tantalum, niobium, zirconium, hafnium, lanthanum, yttrium, cerium, silicon, scandium, chromium, and erbium.

27. The process of claim 1, further comprising depositing at least one dielectric layer between the depositions of said first and second conductive layers which provides an etch stop layer to permit patterning of said second conductive layer without exposing said first conductive layer.

28. The process of claim 1, further comprising removing said first isolation material layer and said first and second conductive material layers from areas of said substrate where they are not needed.

29. The process of claim 1, wherein forming said through-substrate via hole comprises:

forming a substantially cylindrical cavity into said first substrate surface to a first depth and having a first diameter; and
forming a substantially cylindrical cavity into said second substrate surface to a second depth and having a second diameter, said substantially cylindrical cavities forming said via hole through said substrate;
said process further comprising:
forming extended etch patterns in the sidewalls of said cavity formed into the second surface such that said vertical capacitor's surface area is increased.

30. The process of claim 29, said first and second conductive material layers and said first isolation material layer deposited over said extended etch patterns such that said layers are electrically continuous with the first and second conductive material layers and said first isolation material layer deposited within said substantially cylindrical cavity formed into said first surface.

31. The process of claim 30, wherein said extended etch patterns comprise one or more concentric circles separated by trenches around said via hole, said first and second conductive material layers and said first isolation material layer deposited within said trenches.

32. The process of claim 30, wherein said extended etch patterns form a spiral shape.

33. The process of claim 30, wherein said extended etch patterns form a meandering line.

34. The process of claim 29, wherein said second depth is greater than said first depth and said second diameter is greater than or equal to said first diameter.

35. The process of claim 1, wherein said substrate is bonded together with a plurality of additional substrates to form a multi-layer stack of substrates.

36. The process of claim 35, wherein said bonding effects electrical interconnections between individual substrate layers.

37. The process of claim 1, wherein said substrate has a thickness of greater than 50 μm.

38. An all-dry process for fabricating a vertical capacitor in a semiconductor substrate, the substrate having a first surface and a second surface, comprising:
forming a through-substrate via hole in a semiconductor substrate, said via hole having interior walls and an associated length;
forming an initial isolation material layer on said substrate and on said interior walls of said through-substrate via hole;
depositing a first conductive material layer over said initial isolation material layer using ALD such that said first conductive material layer is electrically continuous across the length of said via hole;
depositing, patterning and dry etching an insulating layer onto said first and second surfaces to serve as an etch stop for the selective removal of subsequent layers;
depositing a second isolation material layer onto said oxide layer and over said first conductive material layer within said via hole using ALD;
depositing a second conductive material layer over said second isolation material layer using ALD such that said second conductive material layer is electrically continuous across the length of said via hole;
forming conductive metal traces on one or both of said first and second substrate surfaces to provide electrical connections to the conductive material layers;

such that said first and second conductive material layers and said second isolation material layer form a vertical capacitor.

39. The process of claim 38, wherein said insulating layer is deposited using plasma enhanced chemical vapor deposition (PECVD).

40. The process of claim 38, wherein said insulating layer is an oxide, nitride, or oxynitride layer.

* * * * *